(12) United States Patent
Tsao et al.

(10) Patent No.: US 7,825,034 B2
(45) Date of Patent: Nov. 2, 2010

(54) METHOD OF FABRICATING OPENINGS AND CONTACT HOLES

(75) Inventors: Po-Chao Tsao, Taipei Hsien (TW); Chang-Chi Huang, Miao-Li Hsien (TW); Ming-Tsung Chen, Hsin-Chu Hsien (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 1124 days.

(21) Appl. No.: 11/163,149

(22) Filed: Oct. 6, 2005

(65) Prior Publication Data
US 2007/0082489 A1  Apr. 12, 2007

(51) Int. Cl.
*H01L 21/302* (2006.01)
(52) U.S. Cl. .................. 438/740; 438/243; 438/639; 438/743
(58) Field of Classification Search .......... 438/698, 438/700, 702, 243, 740, 743, 744, 639, 710, 438/720; 134/1.3
See application file for complete search history.

(56) References Cited
U.S. PATENT DOCUMENTS
6,093,641 A    7/2000  Park

| 6,432,814 B1* | 8/2002 | Steiner et al. | 438/624 |
| 6,492,263 B1* | 12/2002 | Peng et al. | 438/639 |
| 6,569,760 B1* | 5/2003 | Lin et al. | 438/633 |
| 6,713,310 B2* | 3/2004 | Song et al. | 438/3 |
| 7,112,506 B2* | 9/2006 | Kim et al. | 438/387 |
| 2004/0018712 A1* | 1/2004 | Plas et al. | 438/612 |
| 2004/0169224 A1 | 9/2004 | Ebihara | |
| 2005/0074965 A1* | 4/2005 | Lee et al. | 438/627 |

FOREIGN PATENT DOCUMENTS
CN    1337740 A    2/2002
CN    1519953 A    8/2004

\* cited by examiner

*Primary Examiner*—Lan Vinh
(74) *Attorney, Agent, or Firm*—Winston Hsu; Scott Margo; Min-Lee Teng

(57) ABSTRACT

A substrate having an etch stop layer and at least a dielectric layer disposed from bottom to top is provided. The dielectric layer is then patterned to form a plurality of openings exposing the etch stop layer. A dielectric thin film is subsequently formed to cover the dielectric layer, the sidewalls of the openings, and the etch stop layer. The dielectric thin film disposed on the dielectric layer and the etch stop layer is then removed.

18 Claims, 13 Drawing Sheets

METHOD OF FABRICATING OPENINGS AND CONTACT HOLES

BACKGROUND OF THE INVENTION

1. Field of the Invention

The present invention pertains to a method of fabricating openings, and more particularly, to a method of forming openings such as contact holes, via holes, and trenches, capable of preventing polymer residues.

2. Description of the Prior Art

The trend to micro-miniaturization, or the ability to fabricate semiconductor devices with feature size smaller than 0.065 micrometers, has presented difficulties when attempting to form contact holes (especially for high aspect ratio contact holes) in a dielectric layer to expose underlying conductive regions.

Please refer to FIGS. 1-4. FIGS. 1-4 are schematic, cross-sectional diagrams showing the process of forming contact holes in accordance with the prior art method. As shown in FIG. 1, a metal-oxide-semiconductor (MOS) transistor device 20 is formed on a semiconductor substrate 10. The MOS transistor device 20, which is isolated by shallow trench isolations (STIs) 24, includes source/drain regions 12, a gate electrode 14, and a spacer structure 16 disposed on the sidewalls of the gate electrode 14. The semiconductor substrate 10 further includes a contact etch stop layer (CESL) 32 deposited over the MOS transistor device 20 and the semiconductor substrate 10, and an inter-layer dielectric (ILD) layer 34 deposited on the contact etch stop layer 32. Subsequently, a bottom anti-reflective coating (BARC) layer 36 is deposited on the ILD layer 34. Then, a photoresist layer 40 is formed on the BARC layer 36, and a conventional exposure-and-development process is carried out to form openings 42 in the photoresist layer 40 to define the locations of contact holes to be formed later.

As shown in FIG. 2, using the photoresist layer 40 as an etching hard mask to etch the exposed BARC layer 36 and the ILD layer 34 through the openings 42 so as to form openings 44. The etching of the ILD layer 34 stops on the contact etch stop layer 32. Subsequently, as shown in FIG. 3, using the remaining photoresist layer 40 and the BARC layer 36 as an etching hard mask to etch the exposed contact etch stop layer 32 through the openings 44, thereby forming contact holes 46. As shown in FIG. 4, the remaining photoresist layer 40 and the BARC layer 36 over the ILD layer 34 are removed.

The above-described prior art method of forming contact holes has several drawbacks. First, when etching the CESL layer 32, the contact profile is also impaired due to the low etching selectivity between the ILD layer 34 and the contact etch stop layer 32. Second, the ILD layer 34 and the underlying CESL layer 32 are etched in-situ, without removing the photoresist layer 40. The polymer residue produced during the etching of the ILD layer 34 and the CESL layer 32 results in a tapered profile of the contact hole 46, thereby reducing the exposed surface area of the source/drain regions 12 and increasing the contact sheet resistance.

In light of the above, there is a need in this industry to provide an improved method of fabricating contact holes in which the contact sheet resistance is reduced without affecting the contact hole profile formed in the ILD layer.

SUMMARY OF THE INVENTION

It is therefore one of the objects of the claimed invention to provide a method of fabricating openings to overcome the aforementioned problems.

According to the claimed invention, a method of fabricating openings is disclosed. The method includes:

providing a semiconductor substrate comprising an etch stop layer and at least a dielectric layer disposed from bottom to top;

patterning the dielectric layer to form a plurality of openings partially exposing the etch stop layer in the dielectric layer;

forming a dielectric thin film covering the dielectric layer, sidewalls of the openings, and the exposed etch stop layer; and removing the dielectric thin film disposed on the dielectric layer and the etch stop layer.

According to the claimed invention, a method of fabricating contact holes is disclosed. The method includes:

providing a semiconductor substrate at least divided into a first device region and a second device region, the semiconductor substrate including an etch stop layer and at least a dielectric layer from bottom to top, and the etch stop layer covering the first device region and exposing the second device region;

patterning the dielectric layer to form a plurality of contact holes in the dielectric layer in the first device region and the second device region, the contact holes formed in the first device region exposing the etch stop layer;

forming a dielectric thin film covering on the dielectric layer, sidewalls of the contact holes, and the etch stop layer in the first device region, and covering on the dielectric layer, sidewalls of the contact holes, and the semiconductor substrate in the second device region; and removing the dielectric thin film disposed on the dielectric layer, the etch stop layer, and the semiconductor substrate.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
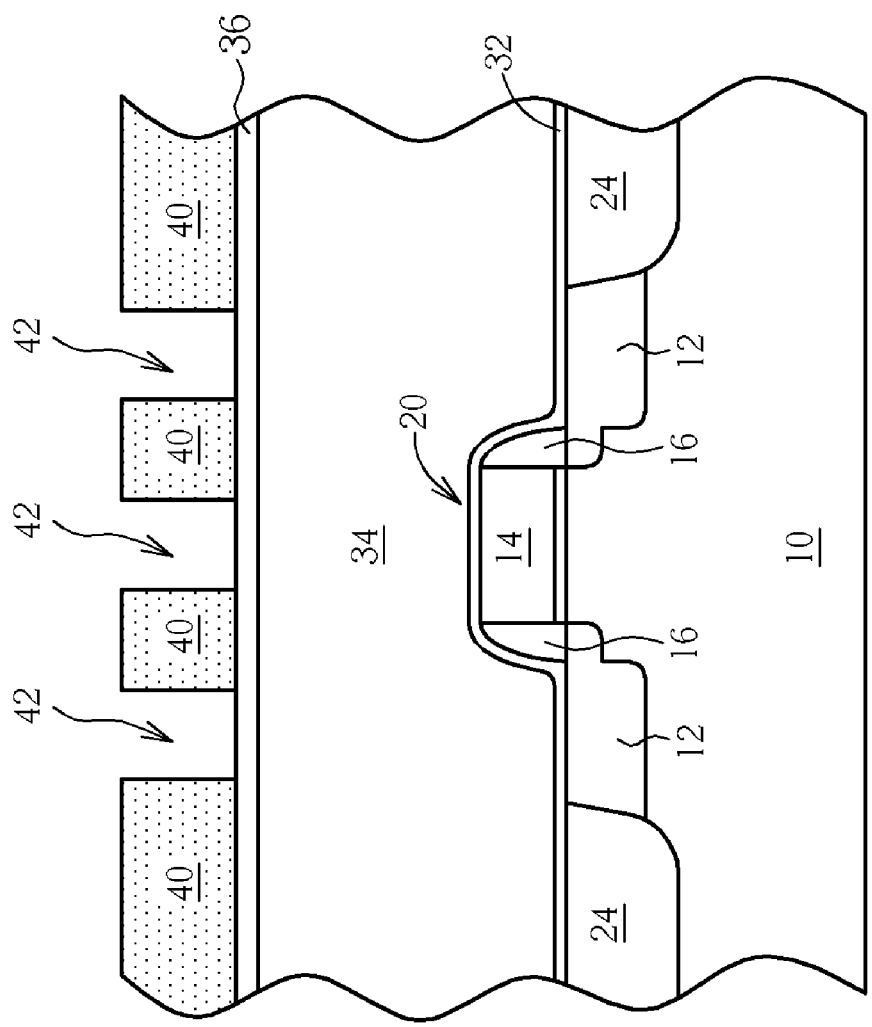
FIGS. 1-4 are schematic, cross-sectional diagrams showing the process of forming contact holes in accordance with the prior art method.
Figure 2:
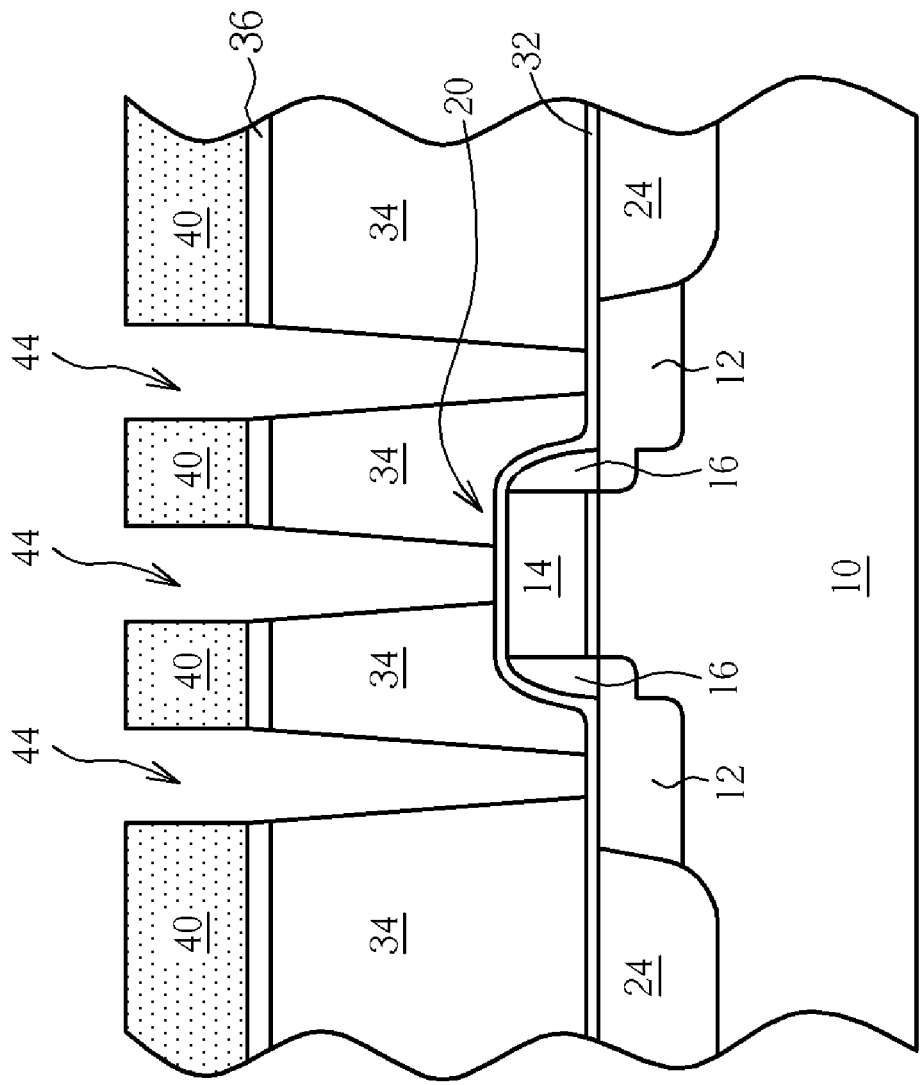
Figure 3:
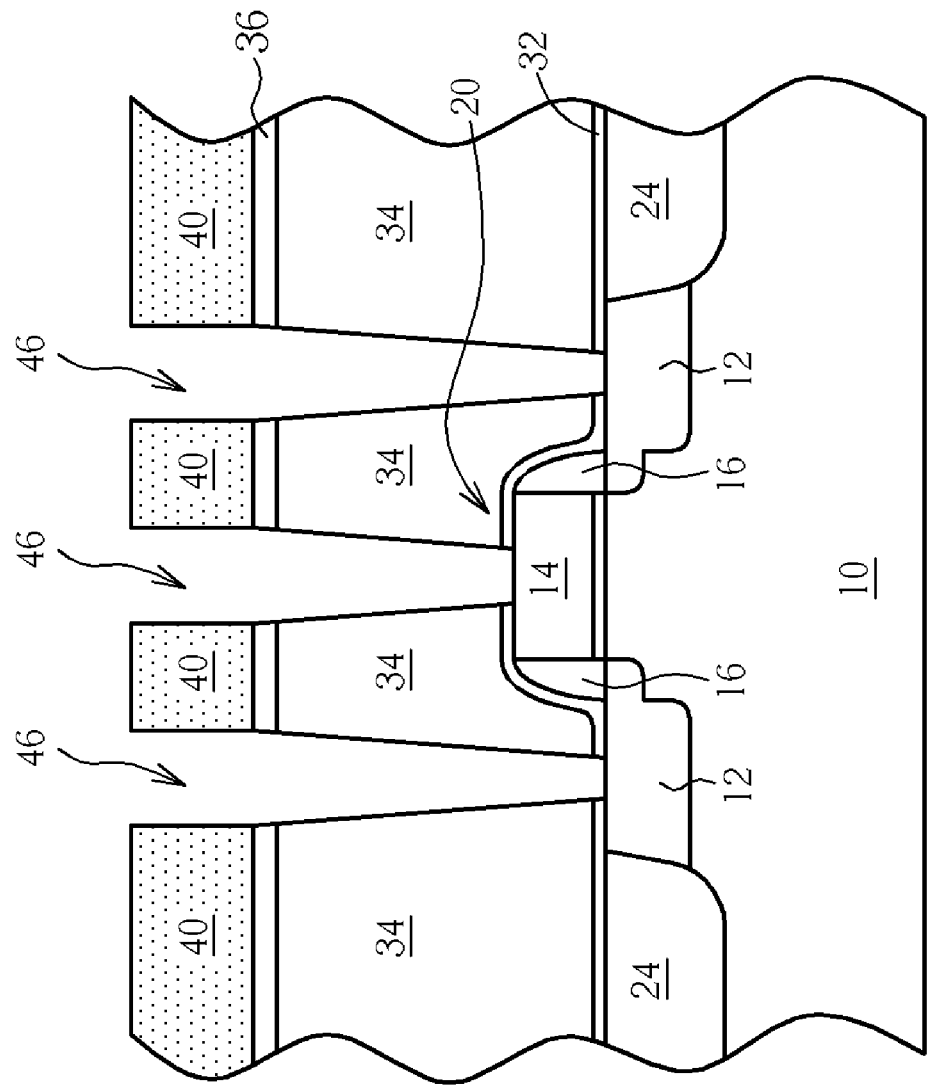
Figure 4:
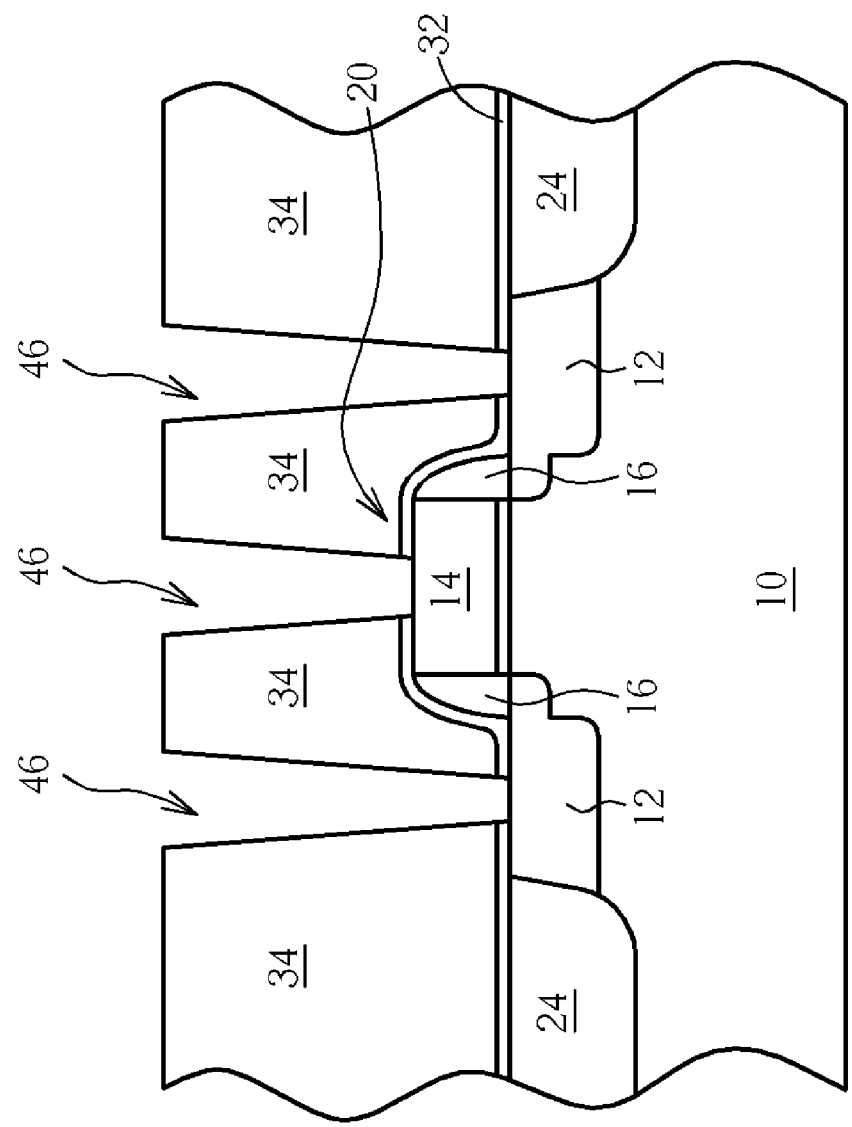
Figure 5:
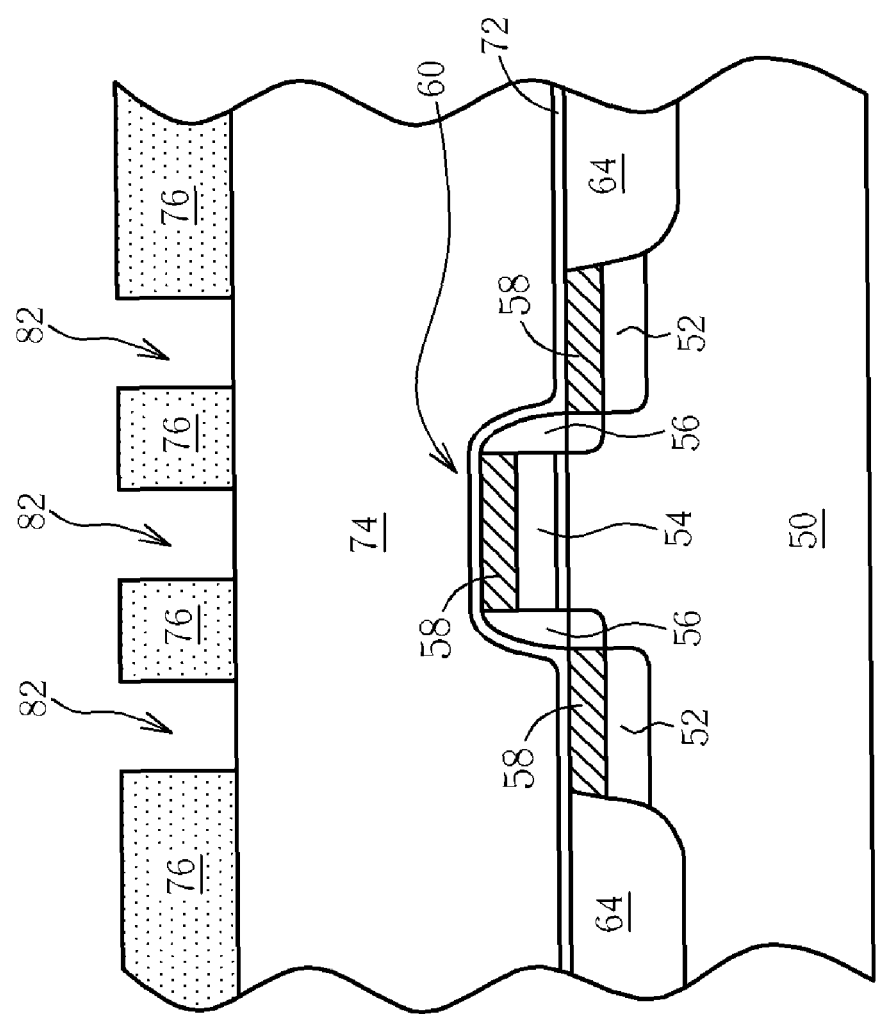
FIGS. 5-8 are schematic, cross-sectional diagrams illustrating a method of fabricating openings in accordance with a preferred embodiment of the present invention.

Please refer to FIGS. 5-8. FIGS. 5-8 are schematic, cross-sectional diagrams illustrating a method of fabricating openings in accordance with a preferred embodiment of the present invention. In this embodiment, a method of forming contact holes is exemplarily illustrated. As shown in FIG. 5, a MOS transistor device 60 is formed on a semiconductor substrate 50. The MOS transistor device 60, which is isolated by shallow trench isolations 64, includes source/drain regions 52, a gate electrode 54, and a spacer structure 56 disposed on the sidewalls of the gate electrode 54. The MOS transistor device 60 may further includes salicides 58 disposed on the surface of the gate electrode 54 and the source/drain regions 52. The semiconductor substrate 50 further includes a contact etch stop layer 72 deposited over the MOS transistor device 60 and the semiconductor substrate 50, and an inter-layer dielectric (ILD) layer 74, deposited on the contact etch stop layer 72.

In selecting the materials of the ILD layer 74 and the contact etch stop layer 72, etching selectivity should be concerned. Normally, the ILD layer 74 may includes tetraethylorthosilicate (TEOS) oxide, un-doped silicon glass, or doped silicon oxide such as borophosphosilicate glass (BPSG), FSG, PSG or BSG. Plasma-enhanced chemical vapor deposition (PECVD) method or other deposition techniques may be used to deposit the ILD layer 74.

Subsequently, a mask layer 76 having a plurality of openings 82 is formed on the ILD layer 74. The openings 82 are disposed corresponding to the gate electrode 54 and the source/drain regions 52 so as to define the locations of contact holes. The mask layer 76 may includes a photoresist layer, a metal layer, or a dielectric layer. Preferably, the mask layer 76 is a metal layer or a dielectric layer such as a silicon nitride layer, so as to prevent polymer residues generated in etching the ILD layer 74.

Figure 6:
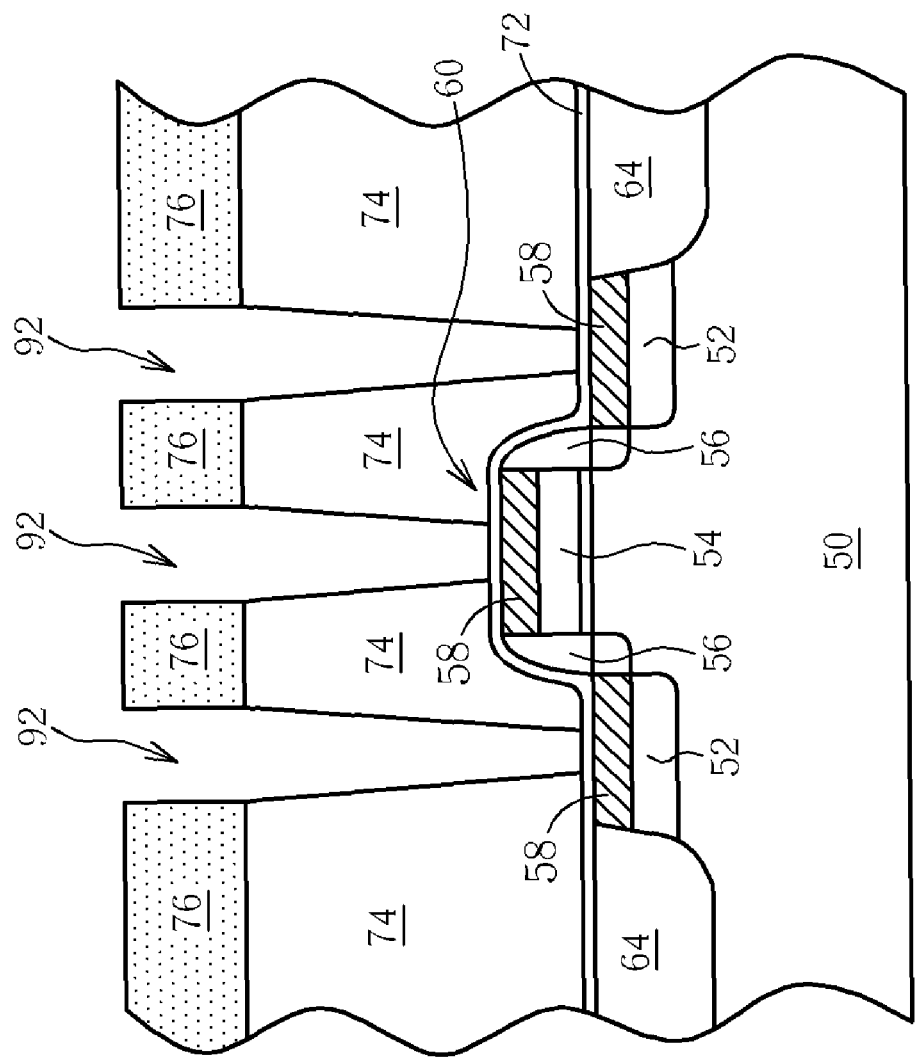
Figure 7:
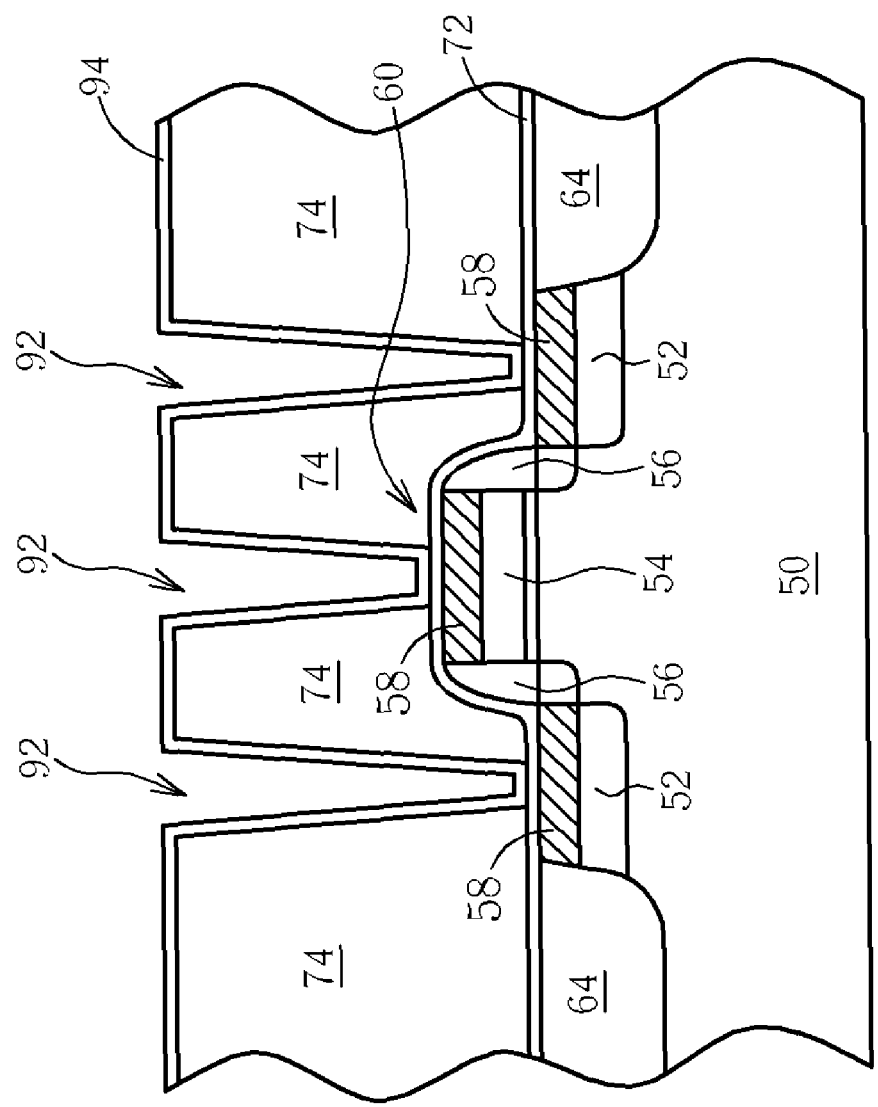

As shown in FIG. 6, an anisotropic etching process is performed using the mask layer 76 as an etching hard mask to etch the ILD layer 74 through the openings 82. The etching stops on the contact etch stop layer 72 so as to form a plurality of openings 92. As shown in FIG. 7, the mask layer 76 is then removed, and a clean process is performed to remove polymer residues or particles remaining in the sidewalls of the openings 92. The clean process can be a wet clean process or a dry clean process, and can be performed in-situ or ex-situ. Then, a dielectric thin film 94 is formed on the ILD layer 74, the sidewalls of the openings 92, and the exposed contact etch stop layer 72. In this embodiment, the contact hole to be formed has a feature size of between 50 and 100 nm (preferably 65 nm), and therefore the thickness of the dielectric thin film 94 is preferably between 0.5 to 10 nm. However, the thickness of the dielectric thin film 94 can be altered in accordance with different process feature size. The dielectric thin film 94 may include a silicon oxide thin film, a silicon nitride thin film, a silicon oxynitride thin film, etc. The dielectric thin film 94 may also be a high k material having a dielectric constant larger than 3.9. For instance, the dielectric thin film 94 may include tantalum oxide thin film, a titanium oxide thin film, a zirconium oxide thin film, a hafnium oxide thin film, hafnium silicon oxide thin film, hafnium silicon oxynitride, etc. The dielectric thin film 94 can be formed by different deposition techniques such as LPCVD, APCVD, PECVD, ALD, etc.

Figure 8:
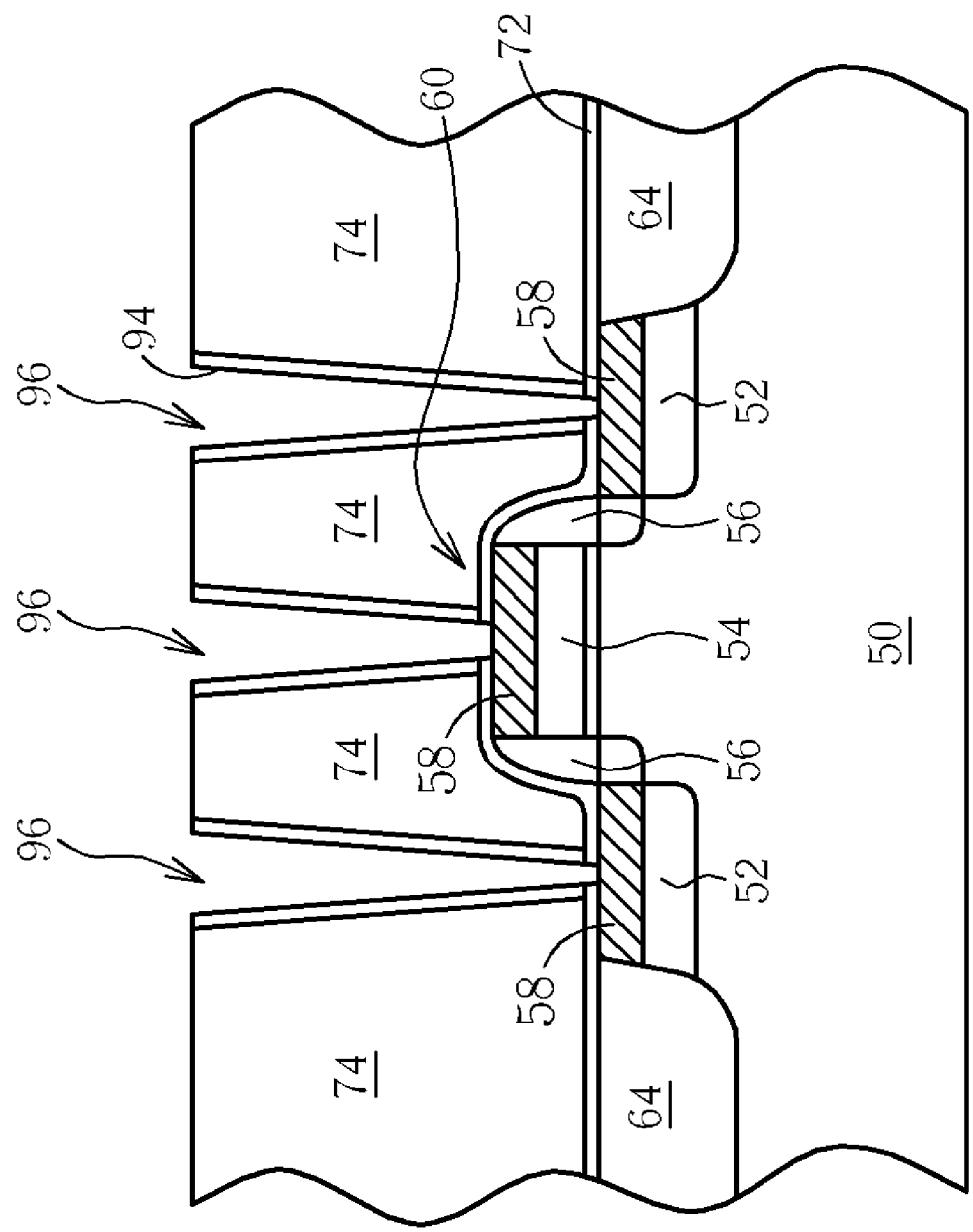

As shown in FIG. 8, an etch back process is performed to etch the dielectric thin film 94 disposed on the ILD layer 74 and the contact etch stop layer 72. Meanwhile, the dielectric thin film 94 disposed on the sidewalls of the openings 92 is reserved. Following that, the contact etch stop layer 72 exposed through the openings 92 is etched so as to form contact holes 96. It should be appreciated that at least a surface treatment may be carried out when the contact holes 96 are formed. For instance, an implantation process can be performed to reduce the resistance of the gate electrode 54 and the source/drain regions 52. Or a clean process can be performed to clean the sidewalls of the contact holes 96 for improving the reliability of the contact plugs to be formed later.

Figure 9:
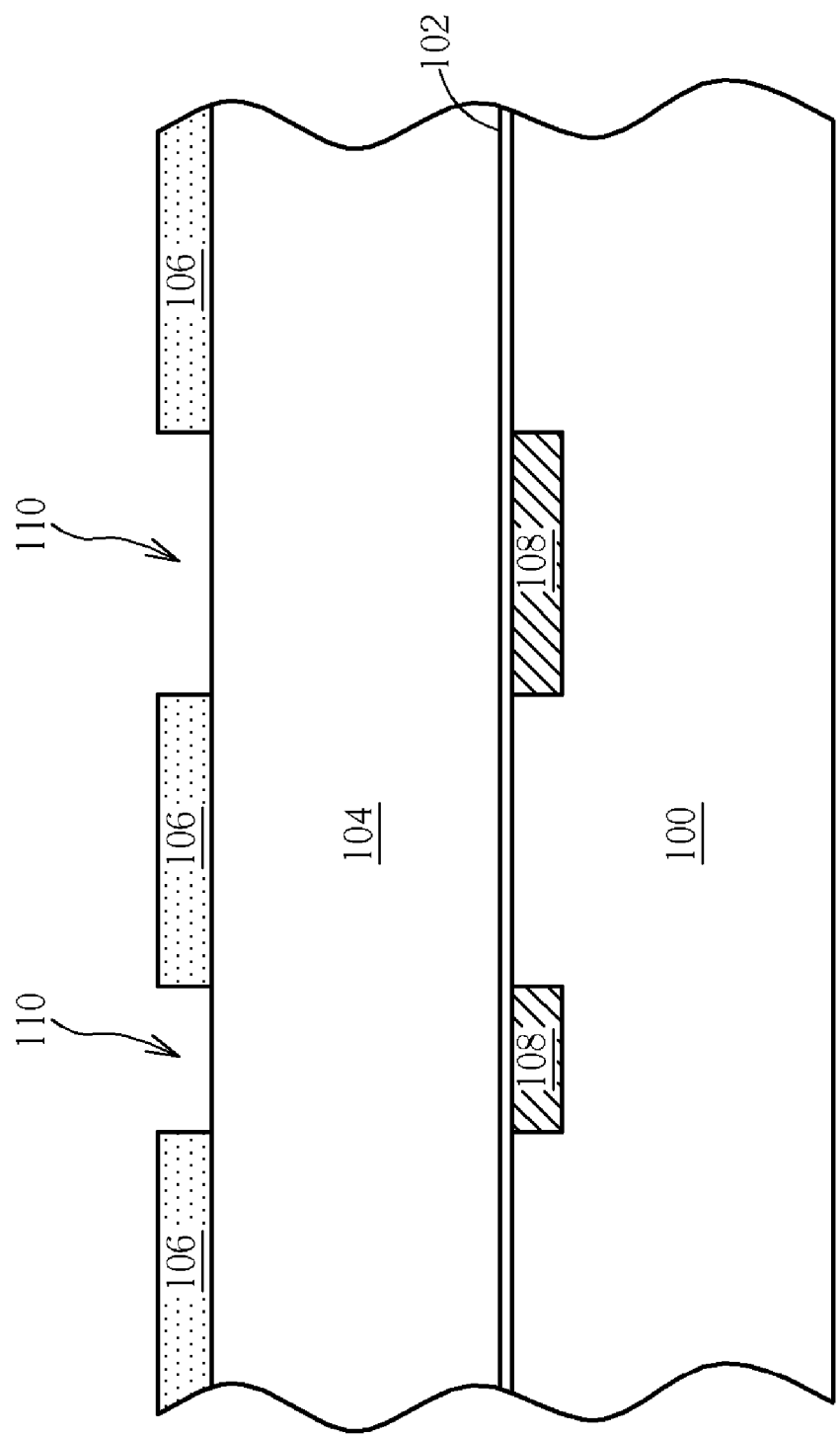
FIGS. 9-12 are schematic, cross-sectional diagrams illustrating a method of fabricating openings in accordance with another preferred embodiment of the present invention.

The method of the present invention is not limited to be applied to fabrications of contact holes, and can be adopted to form various openings such as via holes or trenches. Please refer to FIGS. 9-12. FIGS. 9-12 are schematic, cross-sectional diagrams illustrating a method of fabricating openings in accordance with another preferred embodiment of the present invention. As shown in FIG. 9, a semiconductor substrate 100 including an etch stop layer 102, a dielectric layer 104, and a mask layer 106 is provided. The semiconductor substrate 100 further has a conductive pattern 108, and the mask layer 106 includes a plurality of openings 110 disposed corresponding to the conductive pattern 108.

Figure 10:
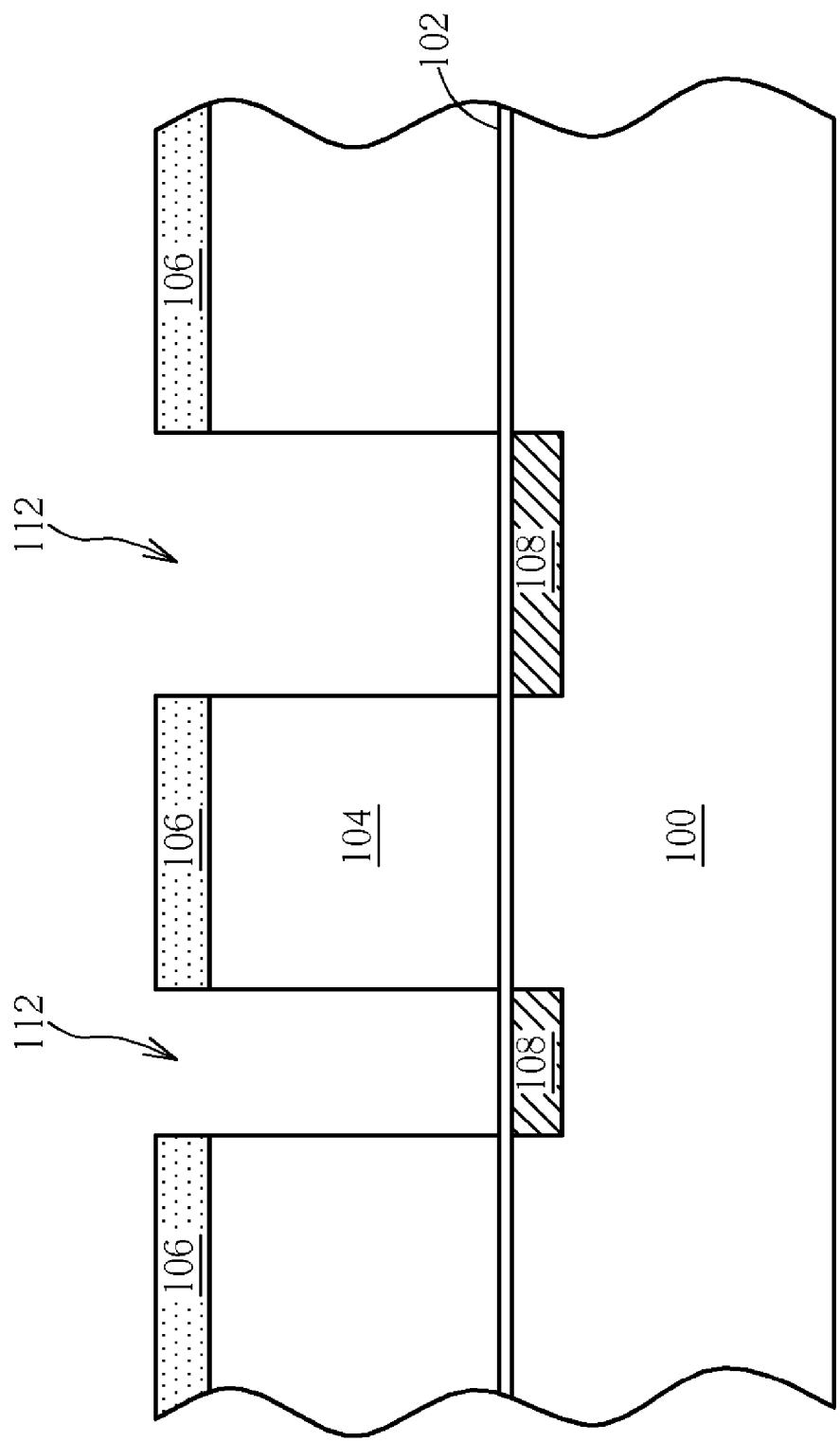
Figure 11:
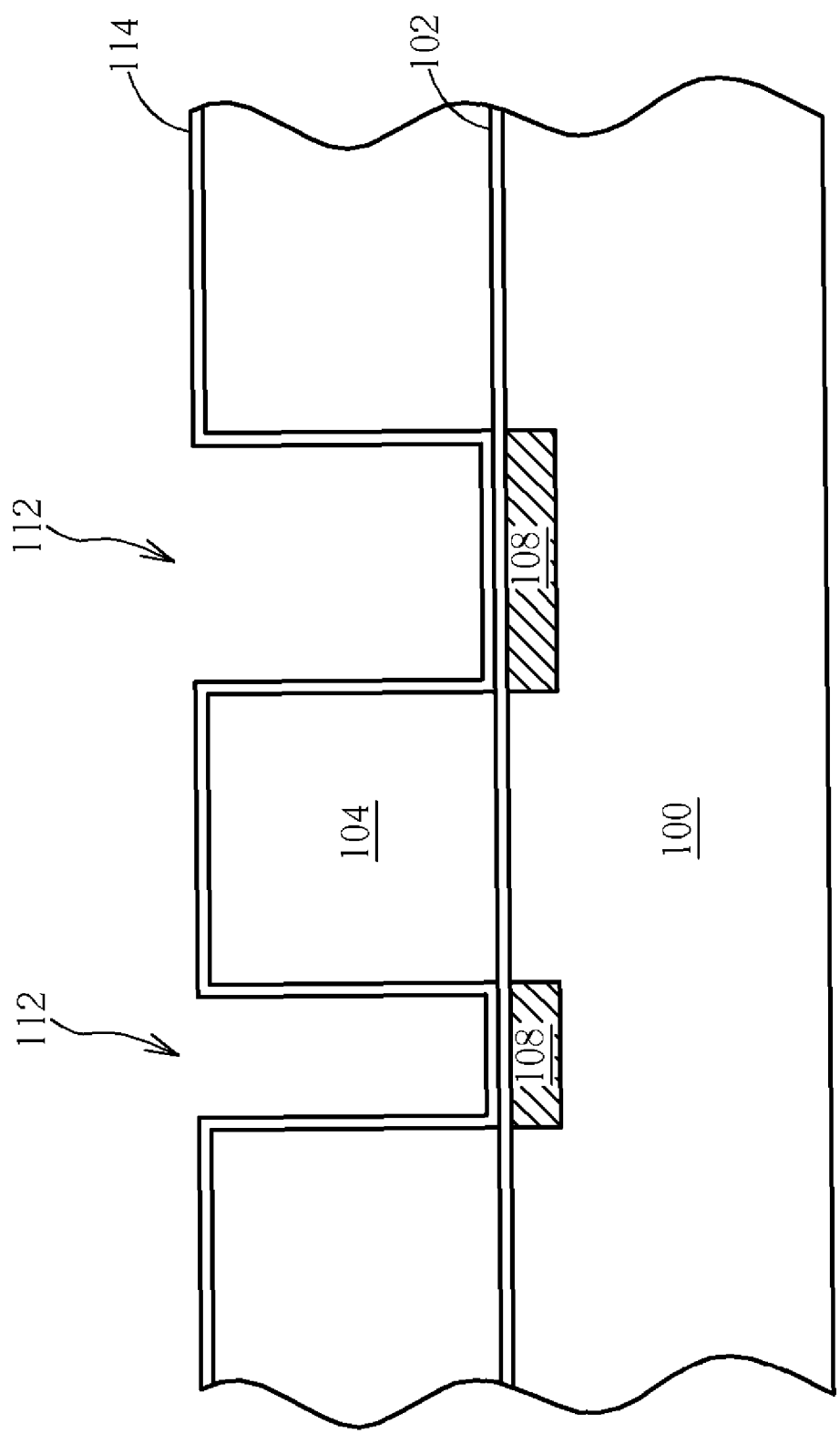
Figure 12:
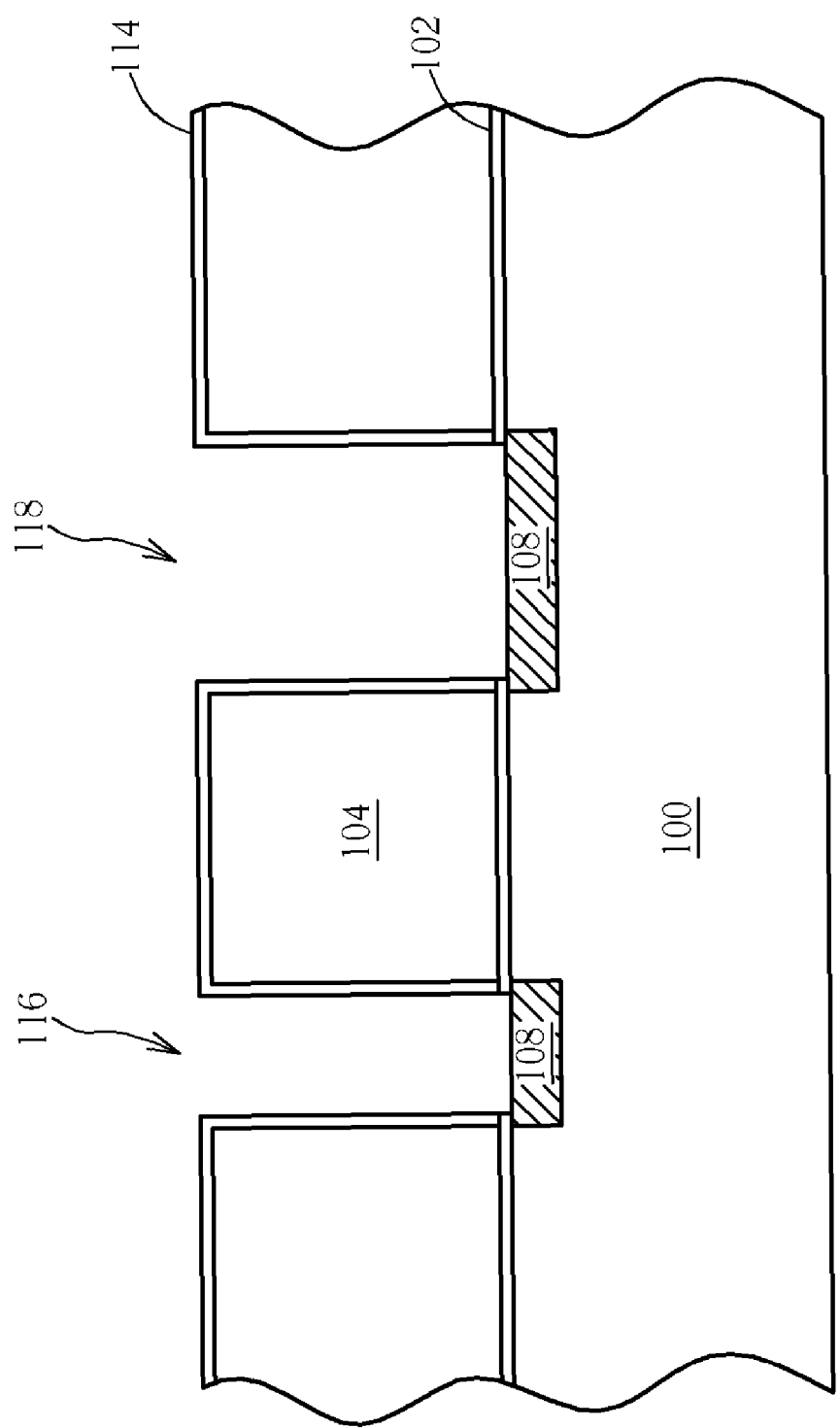

As shown in FIG. 10, an anisotropic etching process is performed using the mask layer 106 as an etching hard mask to form a plurality of openings 112 which expose the etch stop layer 102 in the dielectric layer 104. As shown in FIG. 11, the mask layer 106 is removed, and a dielectric thin film 114 is deposited on the dielectric layer 104, the sidewalls of the openings 112, and the exposed etch stop layer 102. As shown in FIG. 12, an etch back process is performed to etch the dielectric thin film 114 disposed on the dielectric layer 104 and the exposed etch stop layer 102. Following that, the exposed etch stop layer 102 is etched so as to form a via hole 116 and a trench 118. It is appreciated that a clean process may be performed subsequent to removing the mask layer 106 and a surface treatment may be carried out when the via hole 116 and the trench 118 are formed. In addition, the materials of the etch stop layer 102, the dielectric layer 104, the mask layer 106, and the dielectric thin film 114 have been disclosed in the above-described embodiment, and thus are not redundantly described here.

Figure 13:
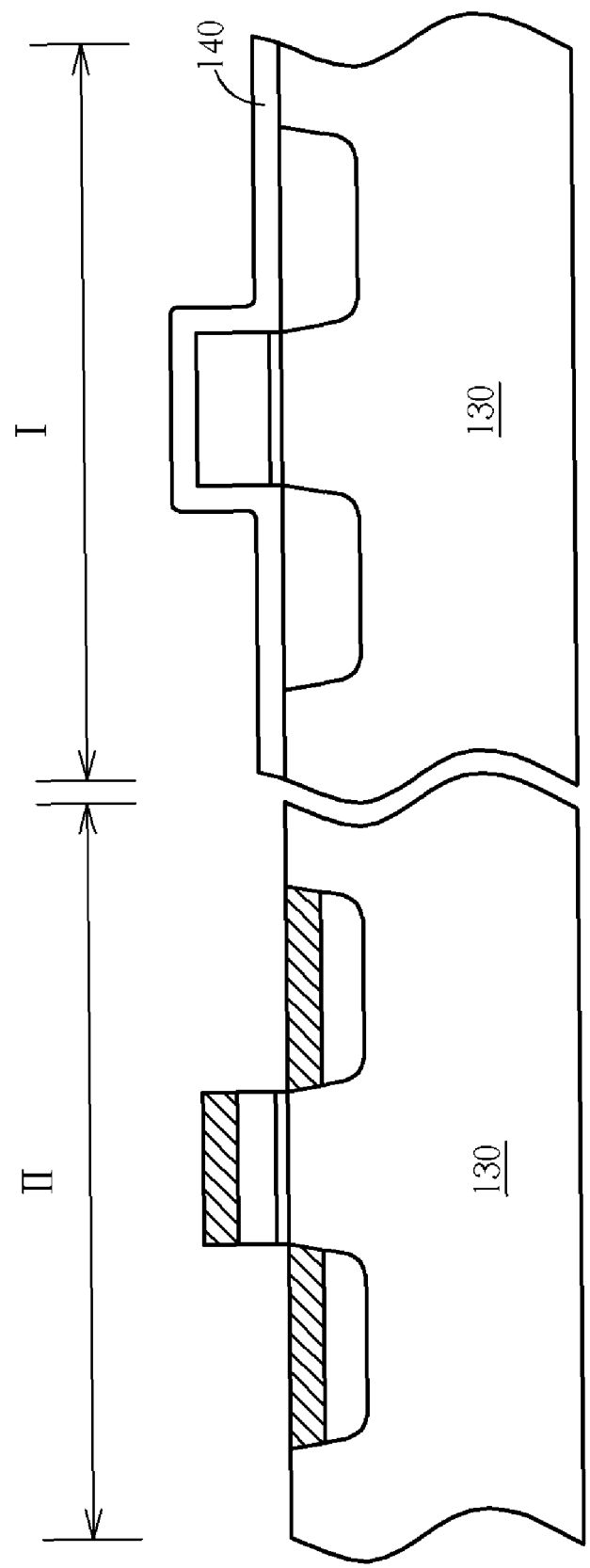
FIG. 13 is a schematic, cross-sectional diagram illustrating a method of forming openings according to still another preferred embodiment of the present invention.

Another benefit of the method of the present invention is the etch stop layer may be a salicide block (SAB). Please refer to FIG. 13. FIG. 13 is a schematic, cross-sectional diagram illustrating a method of forming openings according to still another preferred embodiment of the present invention. As shown in FIG. 13, a semiconductor substrate 130 is provided. The semiconductor substrate 130 is divided into a first device region I e.g. an ESD device region or a memory array region, and a second device region II e.g. a logic device region. Normally, the gate electrode and the source/drain regions of a logic device require salicides, while those of an ESD device or a memory device do not. Therefore, the first device region I is covered with an SAB 140 while performing a salicidation process. In this embodiment, the SAB 140 covering the first device region 140 is kept and used as an etch stop layer in etching a dielectric layer. In such a case, the process step is reduced. It is to be noted that the steps of forming the openings have been clearly described in the aforementioned embodiments, and thus are not redundantly described here.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. A method of fabricating openings comprising:
providing a semiconductor substrate comprising an etch stop layer and at least a dielectric layer sequentially formed thereon;
patterning the dielectric layer to form a plurality of openings in the dielectric layer, the openings partially exposing the etch stop layer;
forming a dielectric thin film covering the dielectric layer, sidewalls of the openings, and the exposed etch stop layer;
removing the dielectric thin film disposed on the dielectric layer and the etch stop layer, wherein the dielectric thin film disposed on the sidewalls of the openings is reserved; and performing a surface treatment comprising an implantation process or a clean process subsequent to removing the dielectric thin film disposed on the dielectric layer and the etch stop layer.

2. The method of claim 1, wherein the openings comprise contact holes, via holes, and trenches.

3. The method of claim 1, wherein the dielectric thin film comprises a silicon oxide thin film, a silicon nitride thin film, or a silicon oxynitride thin film.

4. The method of claim 1, wherein the dielectric thin film comprises a tantalum oxide thin film, a titanium oxide thin film, a zirconium oxide thin film, a hafnium oxide thin film, hafnium silicon oxide thin film, or hafnium silicon oxynitride.

5. The method of claim 1, wherein the dielectric thin film comprises a high k material having a dielectric constant greater than 3.9.

6. The method of claim 1, wherein the openings have a dimension of between 50 and 100 nm, and the dielectric thin film has a thickness of between 0.5 to 10 nm.

7. The method of claim 1, further comprising performing a clean process prior to forming the dielectric thin film.

8. The method of claim 1, wherein patterning the dielectric layer is carried out by a mask layer together with an etching process, and the mask layer comprises a photoresist layer, a metal layer, or a dielectric layer.

9. A method of fabricating contact holes comprising:
providing a semiconductor substrate at least divided into a first device region and a second device region, the semiconductor substrate comprising an etch stop layer and at least a dielectric layer sequentially formed thereon, the etch stop layer covering the first device region and exposing the second device region;
patterning the dielectric layer to form a plurality of contact holes in the dielectric layer in the first device region and the second device region, the contact holes formed in the first device region exposing the etch stop layer;
forming a dielectric thin film covering on the dielectric layer, sidewalls of the contact holes, and the etch stop layer in the first device region, and covering on the dielectric layer, sidewalls of the contact holes, and the semiconductor substrate in the second device region; and
removing the dielectric thin film disposed on the dielectric layer, the etch stop layer, and the semiconductor substrate, wherein the dielectric thin film disposed on the sidewalls of the contact holes is reserved.

10. The method of claim 9, wherein the etch stop layer comprises a salicide block (SAB).

11. The method of claim 9, wherein the dielectric thin film comprises a silicon oxide thin film, a silicon nitride thin film, or a silicon oxynitride thin film.

12. The method of claim 9, wherein the dielectric thin film comprises a tantalum oxide thin film, a titanium oxide thin film, a zirconium oxide thin film, a hafnium oxide thin film, hafnium silicon oxide thin film, or hafnium silicon oxynitride.

13. The method of claim 9, wherein the dielectric thin film comprises a high k material having a dielectric constant greater than 3.9.

14. The method of claim 9, wherein the contact holes have a dimension of between 50 and 100 nm, and the dielectric thin film has a thickness of between 0.5 to 10 nm.

15. The method of claim 9, further comprising performing a clean process prior to forming the dielectric thin film.

16. The method of claim 9, wherein patterning the dielectric layer is carried out by a mask layer together with an etching process, and the mask layer comprises a photoresist layer, a metal layer, or a dielectric layer.

17. The method of claim 9, further comprising performing a surface treatment subsequent to removing the dielectric thin film disposed on the dielectric layer and the etch stop layer.

18. The method of claim 17, wherein the surface treatment comprises an implantation process or a clean process.

* * * * *